TUNING FORK

Filed April 25, 1960

INVENTORS
ALBERT C. JONES
FREDERICK J. LINGEL
PETER B. TROUP

BY Richard E Horley
THEIR ATTORNEY

United States Patent Office 3,085,168

Patented Apr. 9, 1963

3,085,168
TUNING FORK

Albert C. Jones, Stoneham, Frederick J. Lingel, Lynnfield Center, and Peter B. Troup, Rowley, Mass., assignors to General Electric Company, a corporation of New York Filed Apr. 25, 1960, Ser. No. 24,534
3 Claims. (Cl. 310—25)

The present invention relates to tuning forks and more particularly to tuning forks of the electrically driven type.

Tuning forks of the electrically driven type are widely used as frequency-determining elements in electrical oscillation generators. One such application is in frequency-regulated power supplies used to supply 400 cycle alternating current for powering instruments and other electrical devices used on aircraft. For such applications where available space is usually at a premium, there is a great need for electrically driven tuning forks which are small in size and yet high in efficiency so that the entire power supply comprising the tuning fork and associated amplifier equipment can be mounted in a small space, for example, within an instrument case.

It is accordingly an object of this invention to provide an improved electrically driven tuning fork having structural features permitting substantial reduction in size.

Another object is to provide a tuning fork construction which is simple, rugged, reliable, and which can be built in quantity production at low cost.

A still further object of the invention is to provide an electrically driven tuning fork having improved efficiency so as to permit reduction in size and cost of the associated amplifier equipment with which it is used.

Further objects and advantages of the invention will become apparent as the following description proceeds.

Briefly, in accordance with one aspect of the invention, a tuning fork is provided which permits forming the fork by bending a flat rectangular strip of magnetically permeable, resilient material into a U-shaped member. The bottom of the fork is rigidly secured as by spot welding to a base having a dome-shaped projection which makes contact with the fork over a small area. This construction is inexpensive and substantially reduces the transmission of vibration energy from the fork to the base, thereby preventing loss in efficiency. The efficiency or "Q" of the fork is further improved by use of pickup and drive coils mounted between the tines of the fork and having cores permanently magnetized and oriented in such a way as to increase substantially the output of the pickup coils.

For a better understanding of the invention, reference should be made to the following detailed description taken in connection with the accompanying drawings in which.

Figures 1, 2, 3, 4, 5, 6:
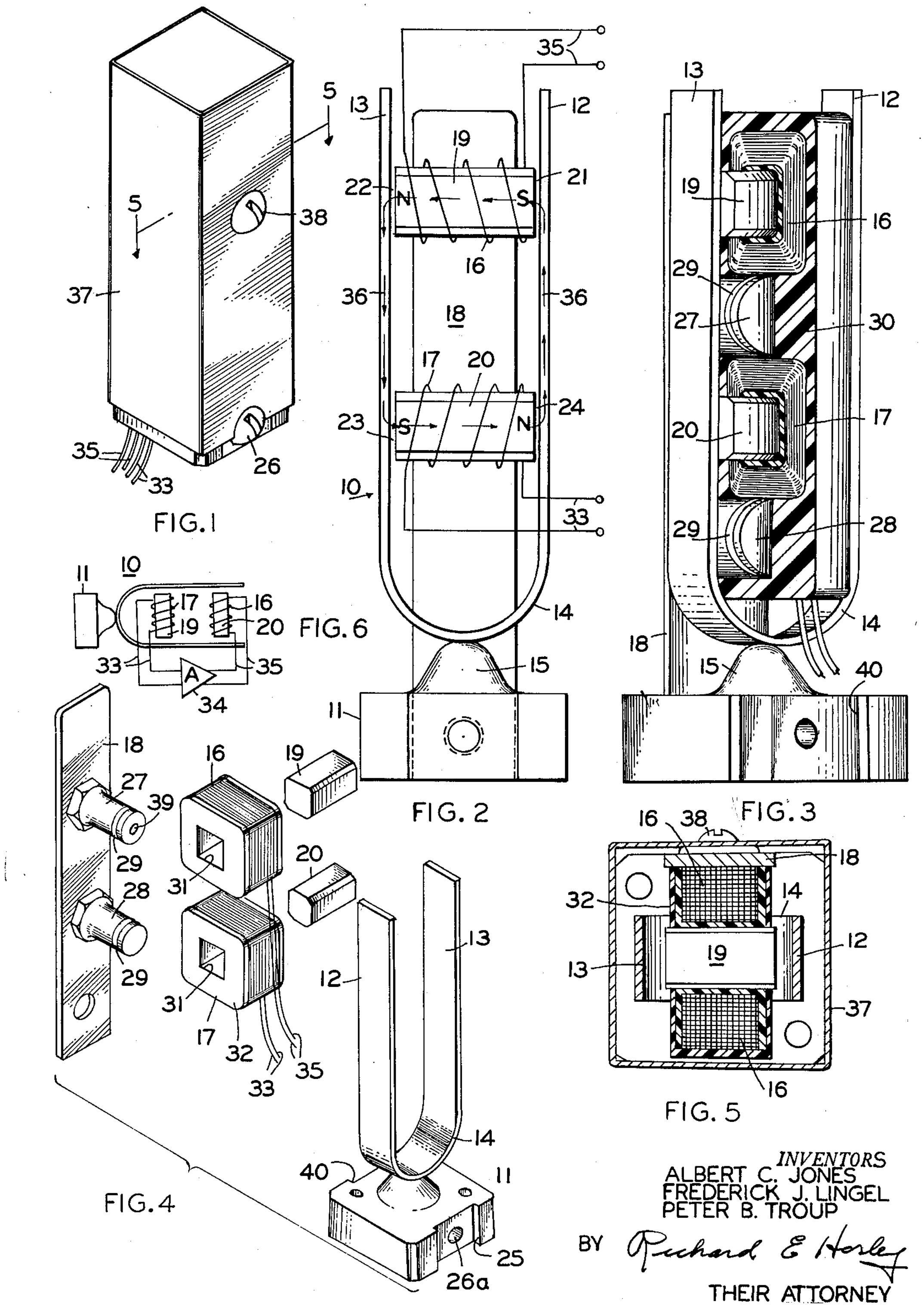
FIG. 1 is an exterior perspective view of a tuning fork embodying the present invention.
FIG. 2 is a front elevation view of the tuning fork showing certain details of the magnet cores, the coils being shown schematically for clarity.
FIG. 3 is a perspective view partly in section showing structural details of the coil mounting arrangement.
FIG. 4 is an exploded perspective view showing the relationship between the coil parts and the tuning fork.
FIG. 5 is a top sectional view taken along the section line 5—5 of FIG. 1.
FIG. 6 is a schematic circuit diagram showing how the pickup and drive coils of the tuning fork are coupled through an electronic amplifier for regenerative oscillation.

Referring now to the drawings, there is disclosed in accordance with the present invention a tuning fork construction comprising a tuning fork indicated generally at 10 mounted on a rectangular base 11. The tuning fork 10 may advantageously be formed by bending a rectangular flat strip of material into a U-shaped member having two spaced parallel tines 12 and 13 connected by a curved bottom portion 14. The base 11, which is preferably formed of a hard metal such as steel, has an upwardly extending projection or dome 15 to which the center of the bottom portion 14 of the tuning fork 10 is rigidly secured as by spot welding. Since the top of the dome 15 has a hemispherical shape, the contact between the two parts is essentially a point contact covering a small area. This construction minimizes the transmission of vibration energy from the fork to the base and hence improves the efficiency or "Q" of the fork.

In order to prevent drift in the natural resonant frequency of the fork with variations in ambient temperature due to changes in physical dimensions and modulus of elasticity, it is preferable to construct the fork of a so-called thermally compensated alloy material having constituents selected to give, with appropriate heat treatment, a positive thermal coefficient of modulus of elasticity as well as a positive thermal coefficient of expansion. Such material is commercially available and sold under the name "Ni-Span-C" which is a nickel, iron, chromium, titanium, and carbon alloy comprising approximately 41 percent nickel, 51 percent iron, 5 percent chromium, 2 percent titanium, .06 percent carbon (max.) and the balance impurities. This material has not only the required resilience for use as a tuning fork but also is magnetically permeable, which is a necessary requirement for electromagnetically exciting the fork as will be apparent from the following description.

In order to provide means for electrically exciting the tuning fork 10, there are provided electromagnetic pickup and drive coils 16 and 17, these coils being mounted between the tines 12 and 13 in vertically spaced relation by means of a support 18 extending upwardly from and secured to the base 11. The pickup coil 16 has a permanent magnet core 19 and the drive coil 17 has a similar permanent magnet core 20, these cores extending transversely between the tines 12 and 13. The magnet cores are preferably formed of magnetizable steel having a degree of permeability to alternating magnetic fields and also sufficient retentivity to retain a degree of permanent magnetization. The magnet cores are also dimensioned and positioned so that the outer ends are spaced from the tines to form air gaps. The air gaps between the ends of core 19 and tines 12 and 13 are identified by the numbers 21 and 22, and the air gaps between the core 20 and the tines 12 and 13 are identified by the numbers 23 and 24.

In the interest of accurately maintaining the proper dimensions of the air gaps 21, 22, 23, and 24, it is important that the coils 16 and 17 and their associated magnet cores 19 and 20 be accurately positioned and supported relative to the tuning fork. In the illustrated preferred embodiment of the invention, this is accomplished by providing in the rectangular base 11 a groove 25 which is accurately machined to receive and position the support 18. The center of the groove is tapped at 26*a* to receive a suitable mounting screw 26 for holding the support 18 in an upright position. As a further means of insuring the rigidity and alignment of the assembly, the coils 16 and 17 and their associated magnet cores 19 and 20 are imbedded in a suitable encapsulating resin such as an epoxy resin which surrounds the cores and coils as well as studs 27 and 28 which are attached to and project inwardly from the support 18. It will be noted that the ends of the studs are provided with grooves 29 which serve to anchor the resin casing when the resin (indicated by the numeral 30) hardens. The proper orientation of the coils and cores is further assured by forming the magnet cores 19 and 20 from bar stock having a square cross section, the cores being received in rectangular openings 31 in coil forms 32 which support the pickup and drive coils 16 and 17.

The tines 12 and 13 of the tuning fork are excited by energizing the drive coil 17 with alternating current, the leads 33 of which are connected to the output of a semiconductor or other suitable type amplifier 34 schematically shown in FIGURE 6. The pickup coil 16 is connected by leads 35 to the input of the amplifier. By an appropriate selection of the gain of the amplifier and the phase relationships between the input and output voltages of the amplifier, the tuning fork is caused to vibrate continuously as its natural resonant frequency.

For sustained vibration the amplifier must, of course, have sufficient capacity to supply the losses in the system. For that reason it is desirable to have the efficiency or "Q" of the tuning fork as high as possible so as to minimize the losses in the system and hence the size and cost of the associated amplifier. In accordance with another aspect of the present invention, the efficiency of the tuning fork is increased by an arrangement of the magnetic circuit now to be described which substantially improves the output of the pickup coil 16. To this end the permanent magnet cores 19 and 20 are polarized so as to form magnet poles adjacent the ends thereof which are indicated in FIGURE 2 of the drawing by the symbols N and S. Further, it will be noted that the polarities of the magnet cores are selected such that the magnet poles of the core ends adjacent each of the tines of the tuning fork are of opposite polarity. Thus, it will be noted that the north pole N of magnet core 19 and the south pole S of magnet core 20 are adjacent the tine 13. Similarly, the south pole S of magnet core 19 and the north pole N of magnet core 20 are adjacent the tine 12. With this polarity arrangement the permanent magnetic flux between the magnet cores 19 and 20 is concentrated in the low reluctance path through the magnetically permeable tines 12 and 13 and crosses the air gaps 21, 22, 23, and 24 in the direction indicated by the arrows 36. By use of this reverse polarity arrangement the magnetic fields in the circuit path indicated are in series aiding relation. This substantially increases the flux threading the pickup coil 16 and this, in turn, increases the output of the coil and efficiency of the system.

In operation it will be understood that when the polarity of alternating current supplied to the drive coil 17 by the amplifier 34 is in one direction, the magnetomotive force supplied by this coil is in the same direction as the magnetic field provided by the permanent magnet core 20 so that these fields aid each other, and the resulting increase in the strength of the field in the magnetic circuit through the tines causes the tines to draw together and approach the ends of the magnet cores. This causes a decrease in the air gaps 21, 22, 23, and 24 and the reluctance of the magnetic circuit, and this causes resulting increase in the magnetic flux through the pickup coil 19. When the polarity of the alternating current supplied to the drive coil 17 is of the opposite polarity, the magnetomotive force provided by the drive coil is in opposition to the permanent magnet field provided by core 20 so that the strength of the magnet field threading the tines is substantially reduced and the tines are permitted to move away from each other and the associated magnet cores. This increases the air gaps 21, 22, 23, and 24 and, of course, the reluctance of the magnetic circuit carrying the flux threading the drive coil 16. The periodic increase and decrease of the flux threading the pickup coil 16 causes an A.C. voltage to be induced therein, the frequency of which is controlled by and related to the natural resonant frequency of the tuning fork. In this way an oscillatory circuit is established, the frequency of which is maintained essentially constant by the action of the tuning fork, and this oscillating circuit can be used to control a power amplifier (not shown) which may supply a constant frequency alternating current to the device or devices to be powered by the frequency regulated power supply system as will be understood by those skilled in the art.

The tuning fork 10 and the associated base 11 are enclosed by a suitable cover 37 having an open bottom dimensioned to receive in close-fitting relation the rectangular base 11. The cover is held in position by a screw 38 which is received in the tapped hole 39 in the upper stud 27. In order to confine the magnetic flux emanating from the magnet core 19 and 20 and further to isolate the tuning fork from the influence of any stray magnetic fields, the cover 37 is preferably formed of a suitable magnetically permeable material such as cold rolled steel. The leads 33 and 35 extending from the pickup and drive coils 16 and 17 may be conveniently brought out from the base through a second groove in the base indicated by number 40.

In addition to having the advantage of high efficiency, the tuning fork assembly forming the subject matter of this invention has the advantage that it is easily and inexpensively constructed and further has small physical dimensions. By way of example, a 400 cycle tuning fork constructed in accordance with the invention and which has been used to control a power amplifier with a 5 watt output had physical dimensions as follows: The tuning fork 10 was formed by bending a rectangular strip of material identified above as "Ni-Span-C," the strip having a thickness of .0225 inch and a width of .187 inch. When bent in to a U-shape, the length of the tines 12 and 13 as measured from the bottom of the curved portion 14 to the outer extremity was 1.25 inches. The overall length of the tuning fork from the bottom of the base 11 to the top of the cover 37 was 1.5 inches, and the lateral dimensions of the cover were 0.5 inch on each side.

In order to minimize the transmission of vibration energy from the tuning fork to the base, it is desirable to keep the area of the weld between the bottom of the curved portion 14 and the top of the dome 15 as small as is consistent with the mechanical strength requirements involved. In the tuning fork construction having the dimensions referred to above, satisfactory strength requirements were met with a spot weld diameter being maintained between the limits of .065 inch and .085 inch. Thus, the diameter of the weld was substantially less than the width of the tines. In addition to keeping the diameter of the weld as small as possible, it is preferable to control the weld by selection of welding pressure and current intensity and duration so as to avoid the formation of fillets between the bottom of the curved portion 14 and the top of the dome 15 since it has been found that the presence of such fillets increases the transmission of vibration energy from the fork to the base. While welding is the preferred manner of rigidly connecting the fork to the base, other methods may be used such as soldering, brazing, cementing, etc.

Although this invention has been described by reference to particular embodiments thereof, it will be understood by those skilled in the art that numerous modifications and substitutions may be effected without departing either in spirit or scope from this invention in its broadest aspects.

What we claim as new and desire to secure by Letters Patent of the United States is:

1. An electromagnetically driven tuning fork comprising a U-shaped member having spaced tines formed of a magnetically permeable, resilient material and pickup and driving coils supported between the tines in spaced relation along the length of the tines, said coils having permanent magnet cores extending transversely between the tines so that the core ends are spaced from the tines to form air gaps, said cores being polarized to form magnet poles adjacent the ends thereof with the polarity selected such that the magnet poles of the core ends adjacent each tine are of opposite polarity whereby a magnetic flux path is established between the cores through the tines and across the air gaps with the permanent magnetic flux from the cores in series aiding relation.

2. An electromagnetically driven tuning fork structure comprising a U-shaped tuning fork having a pair of spaced tines formed of resilient, magnetically permeable material, and a pair of spaced electromagnets disposed between the tines, said electromagnets having permanent magnet cores extending transversely between the tines and spaced therefrom by air gaps, said cores being magnetized so that they are series aiding in a magnetic circuit extending between the ends of the cores, through the tines, and across the air gaps.

3. An electrically driven tuning fork comprising a U-shaped member having spaced tines formed of magnetically permeable material connected by a curved bottom portion, a base having a projection with hemispherically shaped top, said curved bottom portion being rigidly connected to the top of said projection, and a pair of spaced electromagnets positioned transversely between said tines on a support connected to said base, said electromagnets having permanently magnetized cores polarized to provide series aiding magnetic fields in a magnetic circuit including the portion of the tines extending between the cores.

References Cited in the file of this patent

UNITED STATES PATENTS

| | | |
|---|---|---|
| 1,906,985 | Marrison | May 2, 1933 |
| 1,913,331 | Buckingham | June 6, 1933 |
| 2,558,991 | Stanton | July 3, 1951 |
| 2,838,698 | Holt | June 10, 1958 |
| 2,874,602 | Asten | Feb. 24, 1959 |
| 2,926,308 | Godbey | Mar. 15, 1960 |
| 2,956,242 | Grib | Oct. 11, 1960 |